US 9,098,234 B2

(12) United States Patent
Fujiwara

(10) Patent No.: US 9,098,234 B2
(45) Date of Patent: Aug. 4, 2015

(54) DISPLAY DEVICE AND ELECTRONIC APPARATUS

(71) Applicant: Kabushiki Kaisha Toshiba, Tokyo (JP)

(72) Inventor: Nobuto Fujiwara, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 235 days.

(21) Appl. No.: 13/770,990

(22) Filed: Feb. 19, 2013

(65) Prior Publication Data

US 2013/0163171 A1  Jun. 27, 2013

Related U.S. Application Data

(63) Continuation of application No. 13/040,721, filed on Mar. 4, 2011, now abandoned.

(30) Foreign Application Priority Data

May 11, 2010  (JP) ................. 2010-109524

(51) Int. Cl.
| H05K 7/20 | (2006.01) |
| G06F 1/20 | (2006.01) |
| H05K 5/00 | (2006.01) |
| G06F 1/16 | (2006.01) |
| H04N 5/64 | (2006.01) |

(52) U.S. Cl.
CPC .............. *G06F 1/1601* (2013.01); *G06F 1/20* (2013.01); *G06F 1/203* (2013.01); *H04N 5/64* (2013.01); *H05K 7/20145* (2013.01); *H05K 7/20154* (2013.01)

(58) Field of Classification Search
None
See application file for complete search history.

(56) References Cited

U.S. PATENT DOCUMENTS

| 7,113,402 | B2 * | 9/2006 | Rutledge et al. ............... 361/695 |
| 7,310,227 | B2 * | 12/2007 | Kusamoto et al. ............ 361/695 |
| 7,633,756 | B2 * | 12/2009 | Xu ................................. 361/700 |
| 7,675,752 | B2 * | 3/2010 | Hongo .......................... 361/700 |
| 7,755,896 | B2 * | 7/2010 | Tamaki et al. ................. 361/704 |
| 2003/0072134 | A1 * | 4/2003 | Ishikawa et al. .............. 361/687 |
| 2004/0057207 | A1 * | 3/2004 | Ishikawa et al. .............. 361/687 |
| 2004/0070942 | A1 * | 4/2004 | Tomioka et al. .............. 361/700 |
| 2004/0070949 | A1 * | 4/2004 | Oikawa et al. ................ 361/718 |
| 2004/0085734 | A1 * | 5/2004 | Ishikawa et al. .............. 361/704 |

(Continued)

FOREIGN PATENT DOCUMENTS

| JP | 08-263162 A | 10/1996 |
| JP | 2000-223876 A | 8/2000 |

(Continued)

OTHER PUBLICATIONS

Notification of Reasons for Rejection mailed by Japan Patent Office on Jun. 28, 2011 in Japanese Patent Application No. 2010-109524.

(Continued)

*Primary Examiner* — Hoa C Nguyen
*Assistant Examiner* — Xanthia C Cunningham
(74) *Attorney, Agent, or Firm* — Knobbe Martens Olson & Bear LLP

(57) ABSTRACT

According to one embodiment, an electronic apparatus includes a housing, a cooling fan in the housing including an intake and a discharge hole, and a wind shielding portion between the intake of the cooling fan and the discharge hole of the cooling fan. The wind shielding portion partitions at least partially an inner space of the housing.

8 Claims, 14 Drawing Sheets

(56) References Cited

U.S. PATENT DOCUMENTS

| | | | |
|---|---|---|---|
| 2005/0007738 A1* | 1/2005 | Inoue | 361/695 |
| 2005/0030712 A1* | 2/2005 | Faneuf et al. | 361/687 |
| 2006/0072289 A1* | 4/2006 | Rutledge et al. | 361/695 |
| 2006/0092612 A1* | 5/2006 | Inoue | 361/700 |
| 2006/0114653 A1* | 6/2006 | Seto et al. | 361/695 |
| 2006/0133048 A1* | 6/2006 | Kobayashi et al. | 361/720 |
| 2006/0164808 A1* | 7/2006 | Stefanoski | 361/700 |
| 2006/0232934 A1* | 10/2006 | Kusamoto et al. | 361/697 |
| 2007/0035925 A1* | 2/2007 | Kobayashi | 361/688 |
| 2007/0091561 A1* | 4/2007 | Cheng et al. | 361/687 |
| 2007/0121296 A1* | 5/2007 | Wung et al. | 361/700 |
| 2007/0146996 A1* | 6/2007 | Herring et al. | 361/700 |
| 2007/0164427 A1* | 7/2007 | Sauciuc et al. | 257/714 |
| 2007/0236879 A1* | 10/2007 | Kumano et al. | 361/687 |
| 2007/0242438 A1* | 10/2007 | Belits et al. | 361/700 |
| 2008/0068797 A1* | 3/2008 | Iikubo | 361/695 |
| 2008/0074839 A1* | 3/2008 | Tamaki et al. | 361/687 |
| 2008/0112130 A1* | 5/2008 | Nakamura | 361/687 |
| 2008/0180910 A1* | 7/2008 | Tomioka | 361/695 |
| 2008/0198550 A1* | 8/2008 | Wang et al. | 361/700 |
| 2008/0237845 A1* | 10/2008 | Kim et al. | 257/715 |
| 2008/0239667 A1* | 10/2008 | Tanaka | 361/695 |
| 2008/0253083 A1* | 10/2008 | Okutsu | 361/687 |
| 2008/0298011 A1* | 12/2008 | Hongo | 361/687 |
| 2009/0001560 A1* | 1/2009 | Stefanoski | 257/714 |
| 2009/0046426 A1* | 2/2009 | Ishikawa | 361/695 |
| 2009/0129020 A1* | 5/2009 | Fujiwara | 361/697 |
| 2009/0154104 A1* | 6/2009 | Kondo et al. | 361/700 |
| 2009/0168331 A1* | 7/2009 | Fujiwara | 361/679.47 |
| 2009/0201639 A1* | 8/2009 | Wang et al. | 361/679.54 |
| 2009/0219695 A1* | 9/2009 | Tomioka | 361/700 |
| 2010/0079951 A1* | 4/2010 | Okutsu | 361/697 |
| 2010/0128431 A1* | 5/2010 | Eriksen et al. | 361/679.47 |
| 2010/0238619 A1* | 9/2010 | Shirasaka | 361/679.08 |
| 2010/0254083 A1* | 10/2010 | Yang | 361/695 |
| 2010/0254085 A1* | 10/2010 | Hasegawa et al. | 361/695 |

FOREIGN PATENT DOCUMENTS

| | | |
|---|---|---|
| JP | 2002-169628 A | 6/2002 |
| JP | 2002-368467 A | 12/2002 |
| JP | 2003-046046 A | 2/2003 |
| JP | 2003-108269 A | 4/2003 |
| JP | 2006-0156786 | 6/2006 |
| JP | 2006-301715 A | 11/2006 |
| JP | 2007-0011931 | 1/2007 |
| JP | 2007-207944 A | 8/2007 |
| JP | 2007-286785 A | 11/2007 |
| JP | 2007-317973 A | 12/2007 |
| JP | 2008-084019 A | 4/2008 |
| JP | 2008-140055 A | 6/2008 |
| JP | 2009-064349 A | 3/2009 |
| JP | 2009-157828 A | 7/2009 |

OTHER PUBLICATIONS

Final Notice of Rejection mailed by Japan Patent Office on Aug. 30, 2011 in Japanese Patent Application No. 2010-109524.

Notification of Reasons for Rejection mailed by Japan Patent Office on Nov. 8, 2011 in Japanese Patent Application No. 2011-222814, which is a divisional patent application of Japanese patent application No. 2010-109524.

* cited by examiner

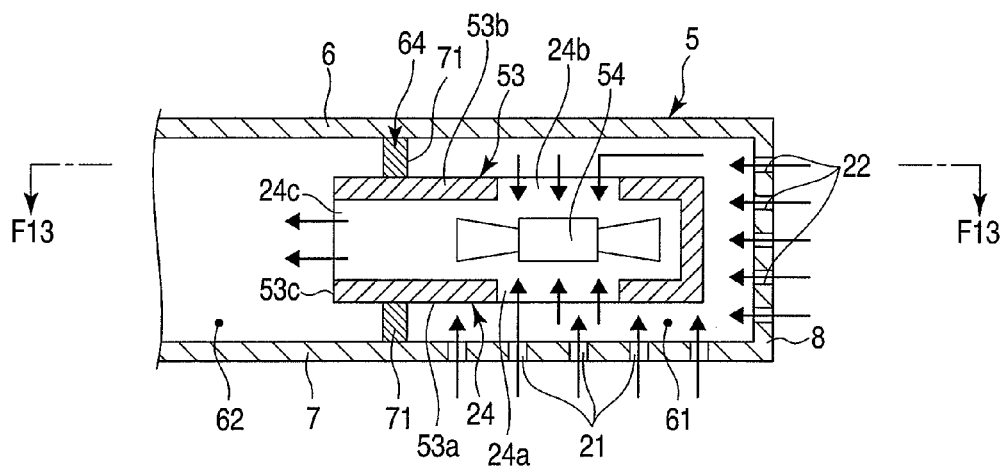
F I G. 12
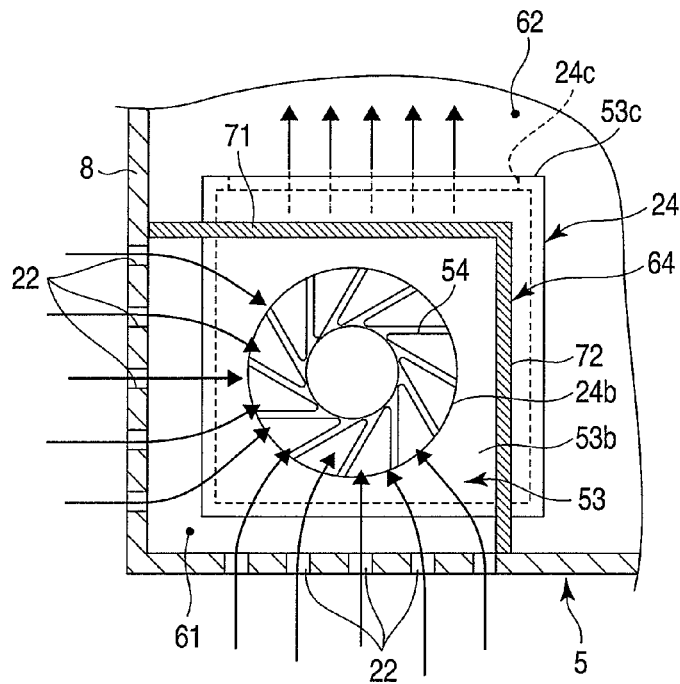
F I G. 13

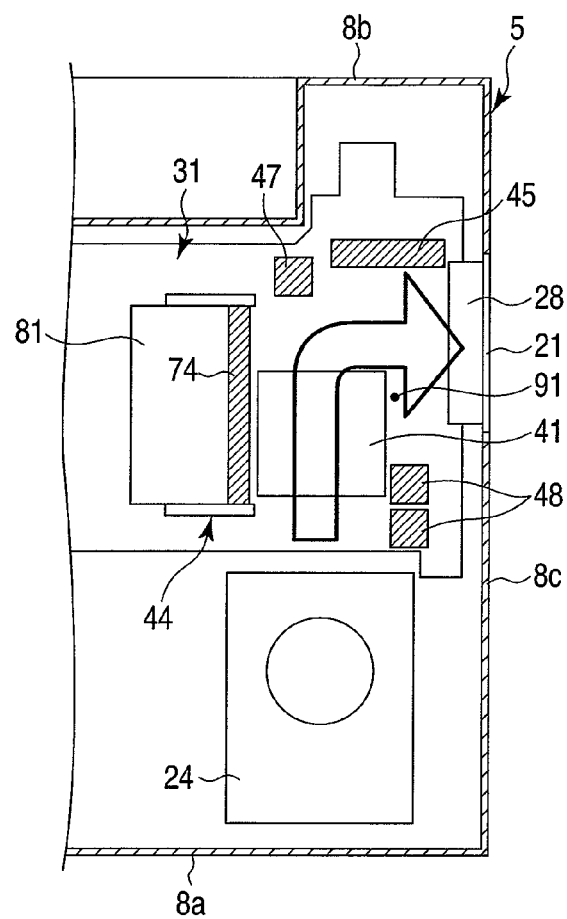
F I G. 14
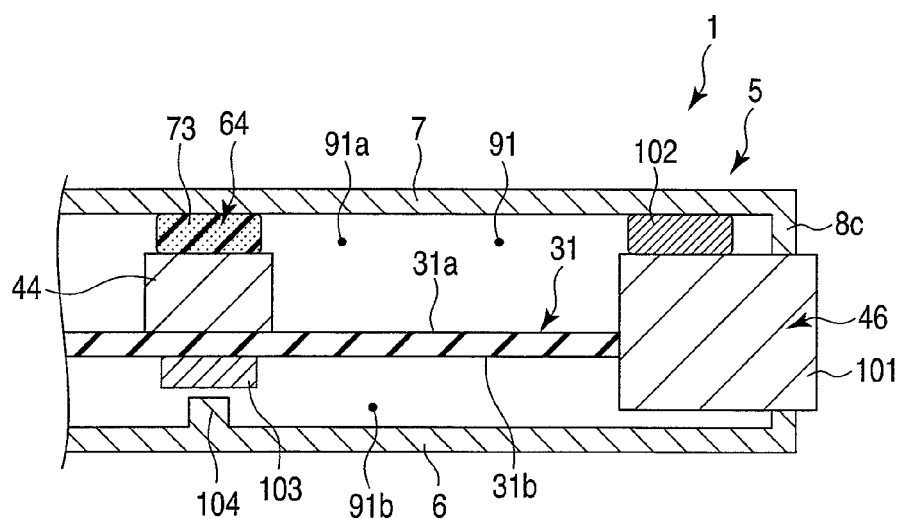
F I G. 15

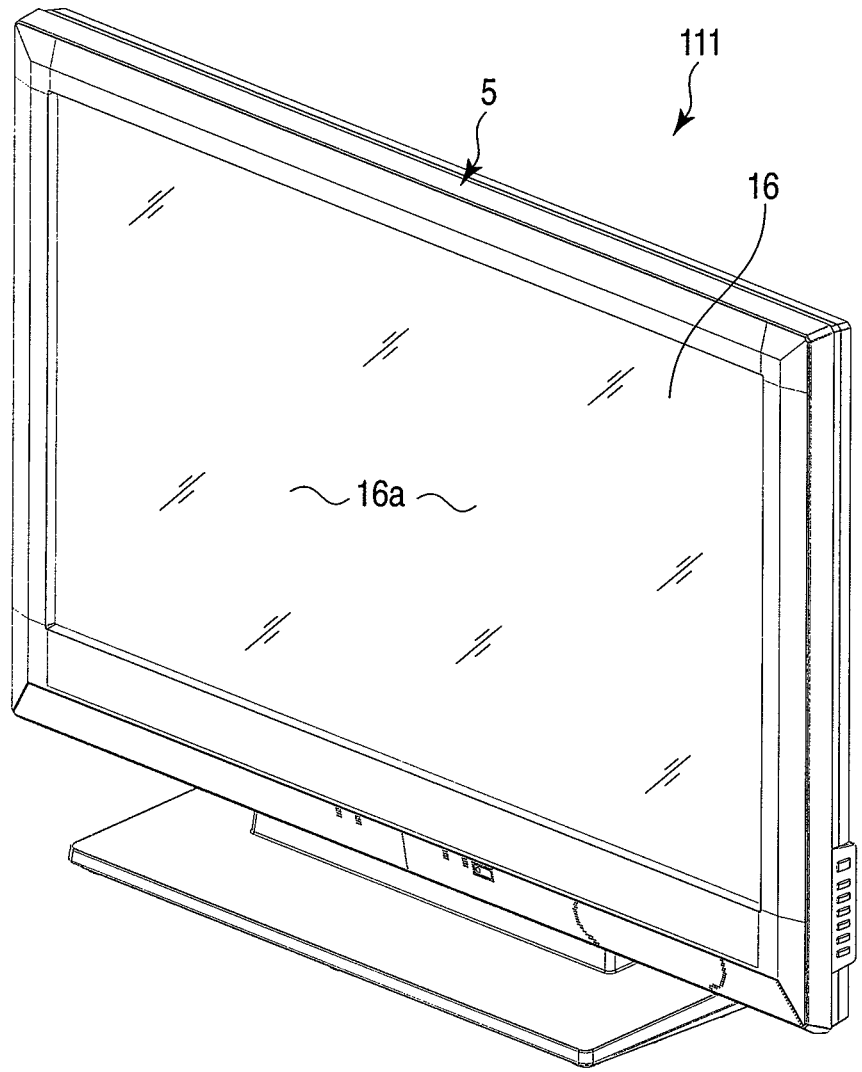
F I G. 16

DISPLAY DEVICE AND ELECTRONIC APPARATUS

CROSS-REFERENCE TO RELATED APPLICATIONS

This application is a continuation of U.S. patent application Ser. No. 13/040,721, filed Mar. 4, 2011, which is based upon and claims the benefit of priority from Japanese Patent Application No. 2010-109524, filed May 11, 2010; the entire contents of both of which are incorporated herein by reference.

FIELD

Embodiments described herein relate generally to a display device and an electronic apparatus including a cooling fan.

BACKGROUND

Some display devices and electronic apparatuses include cooling fans.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

FIG. 12 is an exemplary cross-sectional view schematically illustrating the inside of the electronic apparatus shown in FIG. 8;

FIG. 13 is an exemplary cross-sectional view schematically illustrating the inside of the electronic apparatus taken along the line F13-F13 of FIG. 12;

FIG. 14 is an exemplary cross-sectional view schematically illustrating a duct structure of the electronic apparatus shown in FIG. 8;

FIG. 15 is an exemplary cross-sectional view illustrating an electronic apparatus according to a second embodiment; and FIG. 16 is an exemplary perspective view illustrating a display device according to a third embodiment.

DETAILED DESCRIPTION

Various embodiments will be described hereinafter with reference to the accompanying drawings.

In general, according to one embodiment, an electronic apparatus comprises a housing, a cooling fan in the housing comprising an intake and a discharge hole, and a wind shielding portion between the intake of the cooling fan and the discharge hole of the cooling fan. The wind shielding portion partitions at least partially an inner space of the housing.

Hereinafter, exemplary embodiments applied to a notebook personal computer (hereinafter, referred to as a notebook PC) and a television will be described with reference to the accompanying drawings.

First Embodiment

FIGS. 1 to 14 show an electronic apparatus 1 according to a first embodiment. The electronic apparatus 1 is, for example, a notebook PC. However, electronic apparatuses to which the embodiment can be applied are not limited thereto. The embodiment can be widely applied to various kinds of electronic apparatuses including a display device, such as a television, a recording/reproducing apparatus, a PDA (Personal Digital Assistant), and a game machine.

Figure 1:
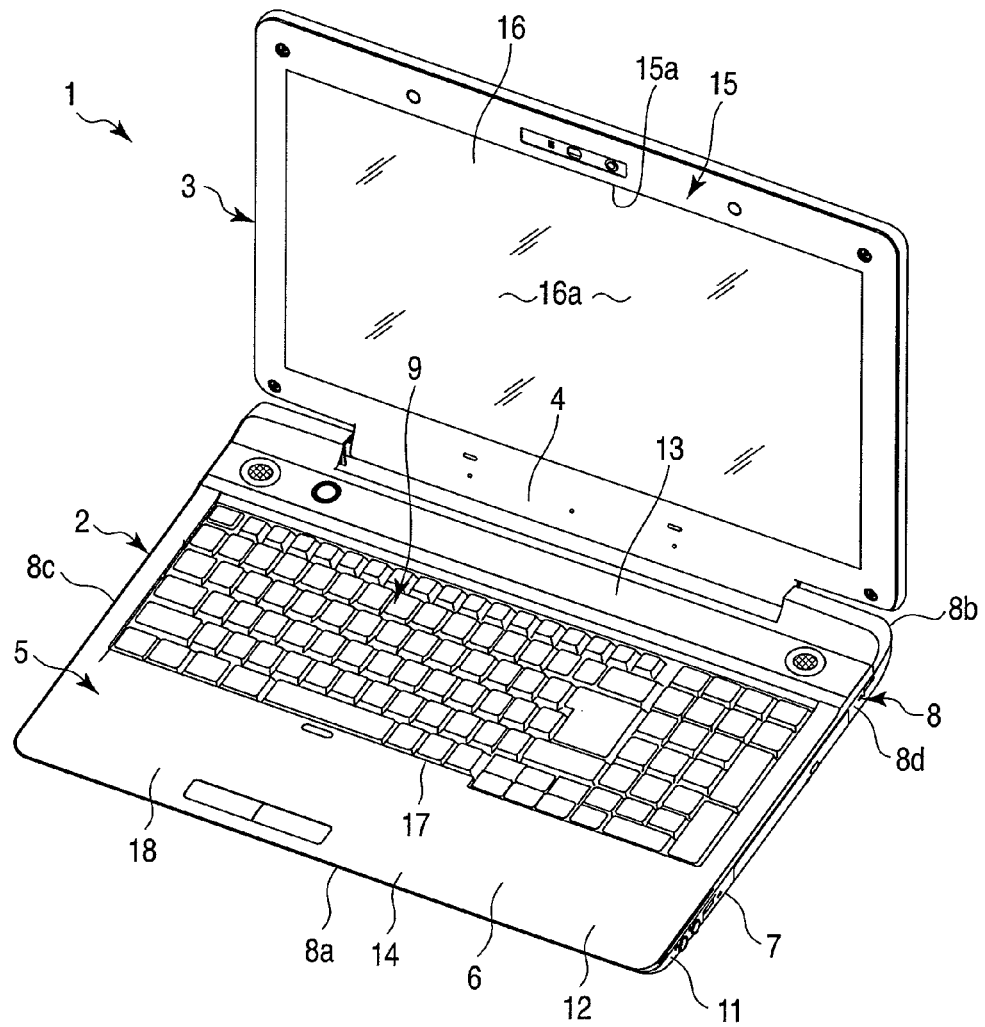
FIG. 1 is an exemplary perspective view illustrating an electronic apparatus according to a first embodiment.

As shown in FIG. 1, the electronic apparatus 1 includes a main unit 2, a display unit 3, and a hinge 4. The main unit 2 is an electronic apparatus main body provided with a main board. The main unit 2 includes a housing 5. The housing 5 has a flat box shape including an upper wall 6, a lower wall 7, and a circumferential wall 8.

The lower wall 7 faces a desk surface when the electronic apparatus 1 is placed on a desk. The lower wall 7 is substantially parallel to the desk surface. The upper wall 6 is opposite to the lower wall 7 with a space therebetween and extends substantially in parallel (that is, substantially in a horizontal direction) to the lower wall 7. A keyboard 9 is attached to the upper wall 6. The circumferential wall 8 rises with respect to the lower wall 7, and connects the edge portion of the lower wall 7 and the edge portion of the upper wall 6.

The housing 5 includes a base 11 and a cover 12. The base 11 includes the lower wall 7 and a part of the circumferential wall 8. The cover 12 includes the upper wall 6 and a part of the circumferential wall 8. The cover 12 is combined with the base 11 to form the housing 5.

The housing 5 includes a rear end portion 13 (first end portion) to which the display unit 3 is rotatably connected and a front end portion 14 (second end portion) disposed opposite to the rear end portion 13. The circumferential wall 8 includes a front wall 8a, a rear wall 8b, a left wall 8c, and a right wall 8d. The front wall 8a extends in the width direction (left-right direction) of the housing 5 at the front end portion 14. The rear wall 8b extends in the width direction of the housing 5 at the rear end portion 13. The left wall 8c and the right wall 8d extend in the depth direction (front-rear direction) of the housing 5 and connect the end portions of the front wall 8a and the end portions of the rear wall 8b.

The display unit 3 is rotatably (openably) connected to the rear end portion 13 of the main unit 2 by the hinge 4. The display unit 3 can be pivoted between a closed position where the display unit 3 falls and covers the main unit 2 from the upper side and an opened position where the display unit 3 rises with respect to the main unit 2.

As shown in FIG. 1, the display unit 3 includes a display housing 15 and a display panel 16 in the display housing 15. A display screen 16a of the display panel 16 can be exposed to the outside through an opening portion 15a in the front wall of the display housing 15.

Figure 9:
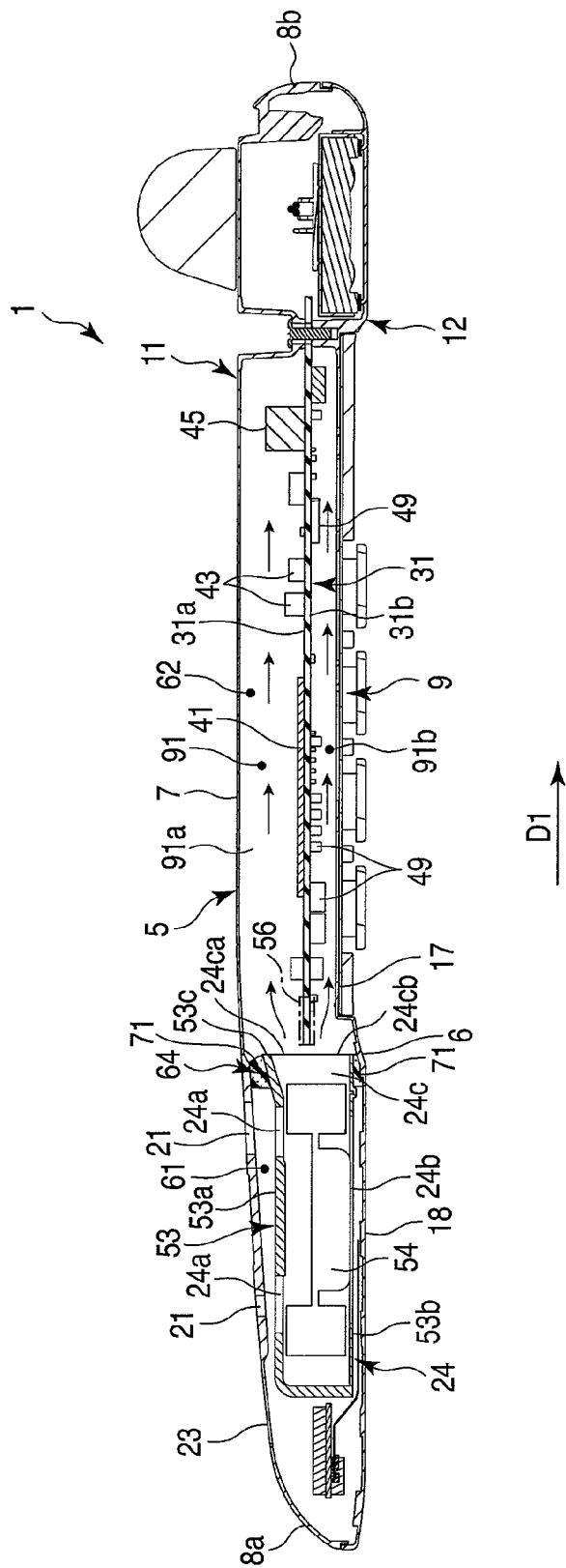
FIG. 9 is an exemplary cross-sectional view illustrating the electronic apparatus taken along the line F9-F9 of FIG. 8.

As shown in FIG. 1, the upper wall 6 includes a keyboard mounting portion 17 to which the keyboard 9 is attached and a palm rest 18. The palm rest 18 is in front of the keyboard mounting portion 17 in the depth direction, that is, between the keyboard mounting portion 17 and the front wall 8a. As shown in FIG. 9, the keyboard mounting portion 17 is recessed from the palm rest 18 to the inside of the housing 5. In this way, the height of the upper surface of the keyboard 9 attached to the keyboard mounting portion 17 is substantially equal to or slightly higher than that of the upper surface of the palm rest 18.

Figure 2:
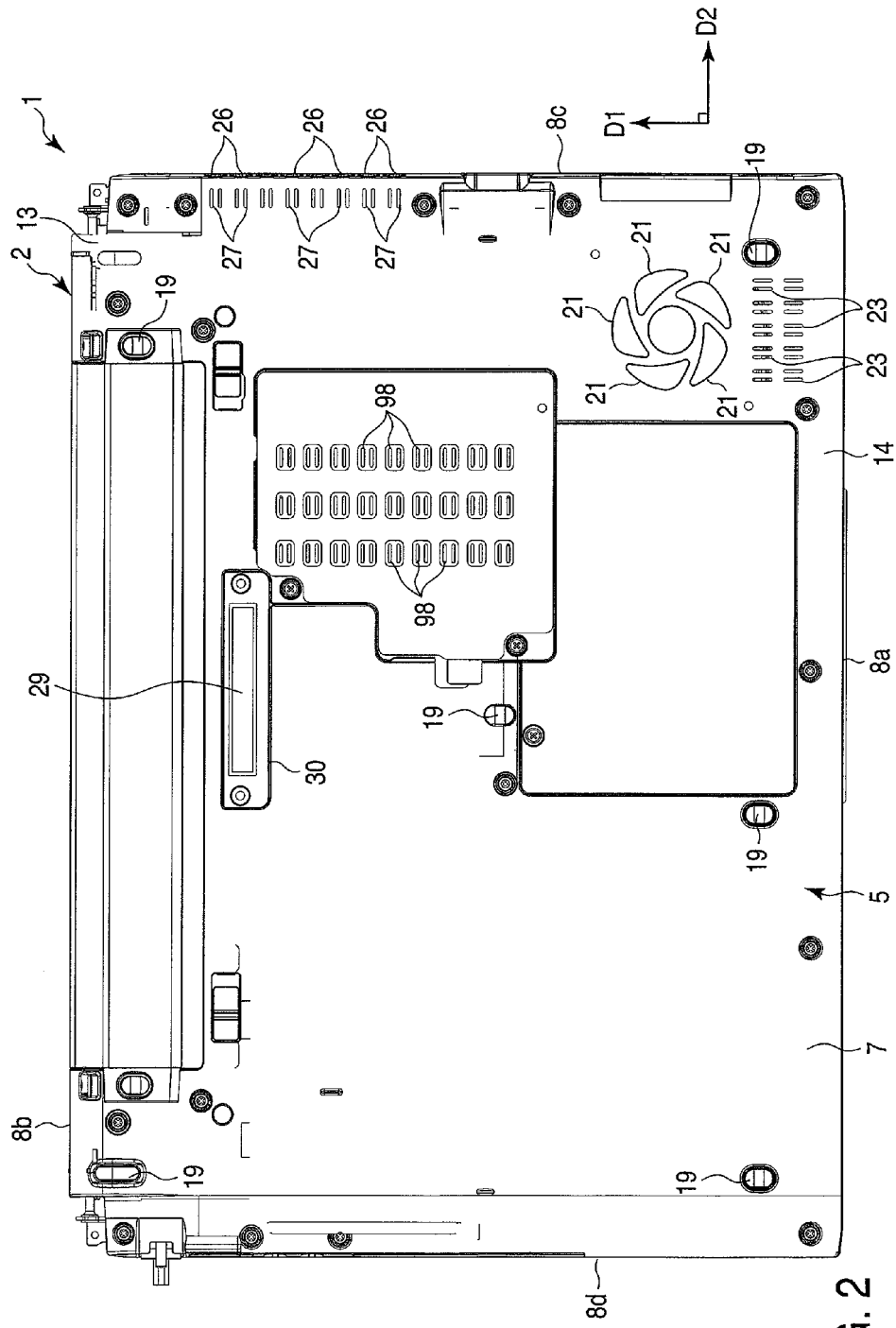
FIG. 2 is an exemplary plan view illustrating a lower wall of the electronic apparatus shown in FIG. 1.
Figure 3:
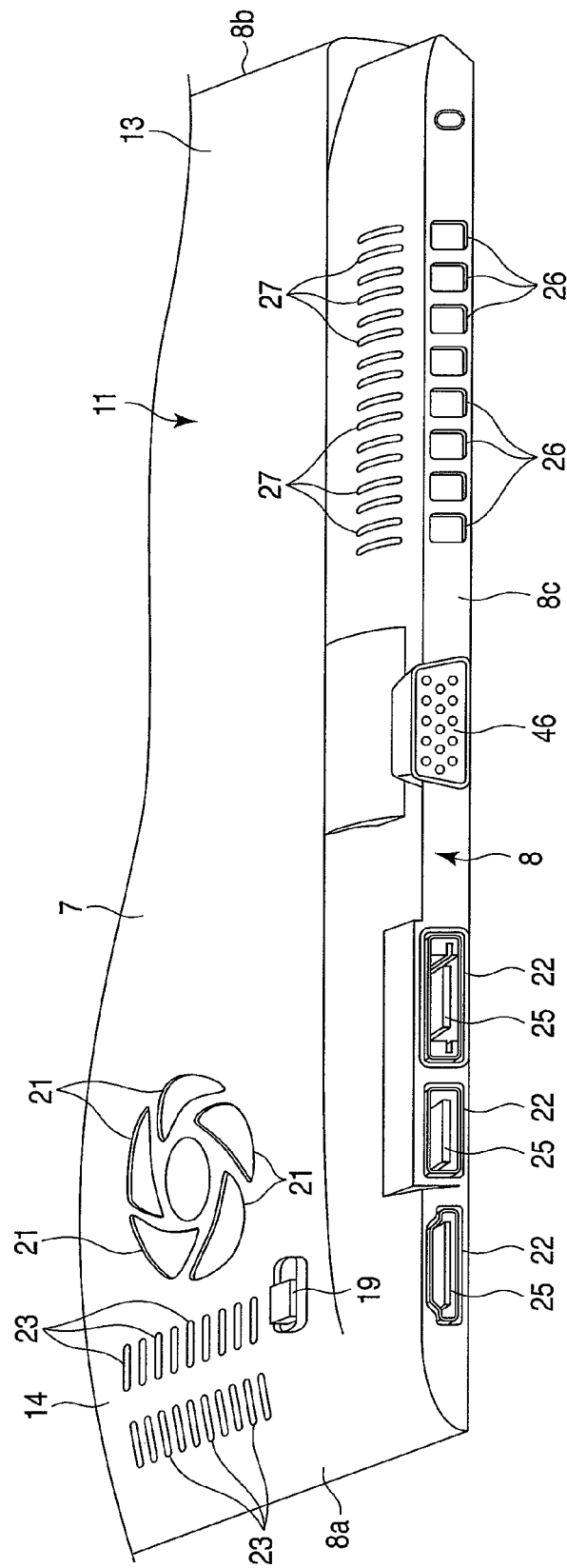
FIG. 3 is an exemplary perspective view illustrating the lower wall and a circumferential wall of the electronic apparatus shown in FIG. 1.

As shown in FIG. 2, a plurality of leg portions 19 is provided on the lower wall 7 of the housing 5. The leg portions 19 come into contact with the desk surface and the lower wall 7 of the housing 5 is supported at a position separated from the desk surface. As shown in FIGS. 2 and 3, the housing 5 includes first inlets 21, second inlets 22, and third inlets 23. The first inlets 21, the second inlets 22, and the third inlets 23 are separated from one another and are provided so as to be concentrated in, for example, the front left portion of the housing 5.

As shown in FIG. 2, the first inlets 21 and the third inlets 23 are provided in the lower wall 7. The first inlets 21 are below a cooling fan 24, which will be described below, so as to face the cooling fan 24. The third inlets 23 are not below the cooling fan 24. The third inlets 23 are located between the first inlets 21 and the front wall 8a.

As shown in FIG. 3, the second inlets 22 are provided in the left wall 8c. The second inlets 22 are, for example, opening portions for exposing various kinds of connectors 25. The second inlets 22 enable fresh air to flow into the housing 5 through the gap between the connector 25 and the housing 5.

As shown in FIG. 3, the housing 5 includes first outlets 26 and second outlets 27. The first outlets 26 are provided in the left wall 8c at the rear end portion 13 of the housing 5, and located, for example, in the side of the keyboard 9 and in the rear end portion 13. The first outlets 26 face a heat sink 28, which will be described below, from the side thereof. The second outlets 27 are provided in the lower wall 7 at the rear end portion 13 of the housing 5 and face the heat sink 28 from the lower side thereof. As shown in FIG. 2, an opening portion 30, through which a docking connector 29 is exposed to the outside, is provided in the lower wall 7.

Figure 4:
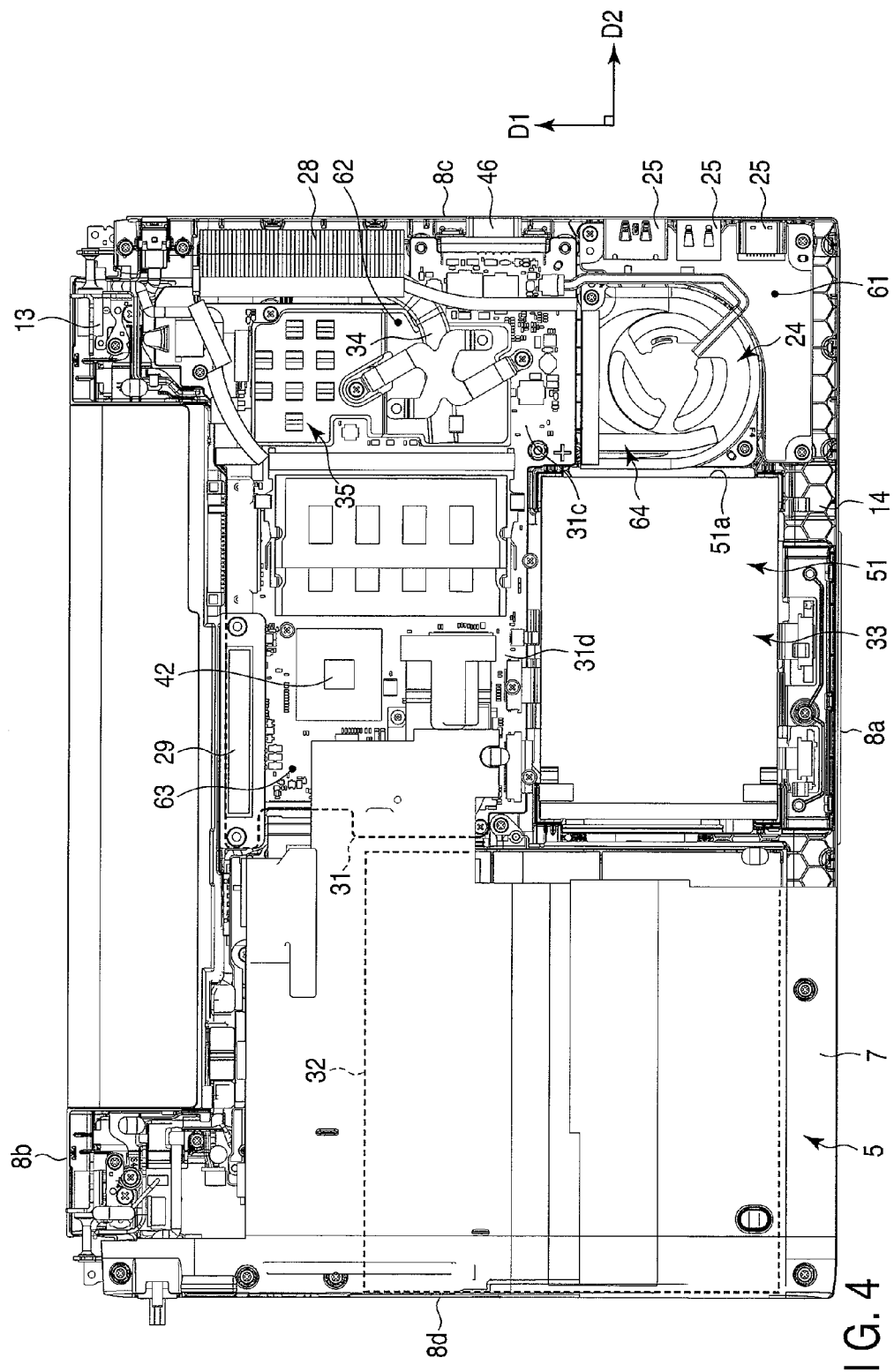
FIG. 4 is an exemplary plan view illustrating the inside of the electronic apparatus shown in FIG. 1.
Figure 5:
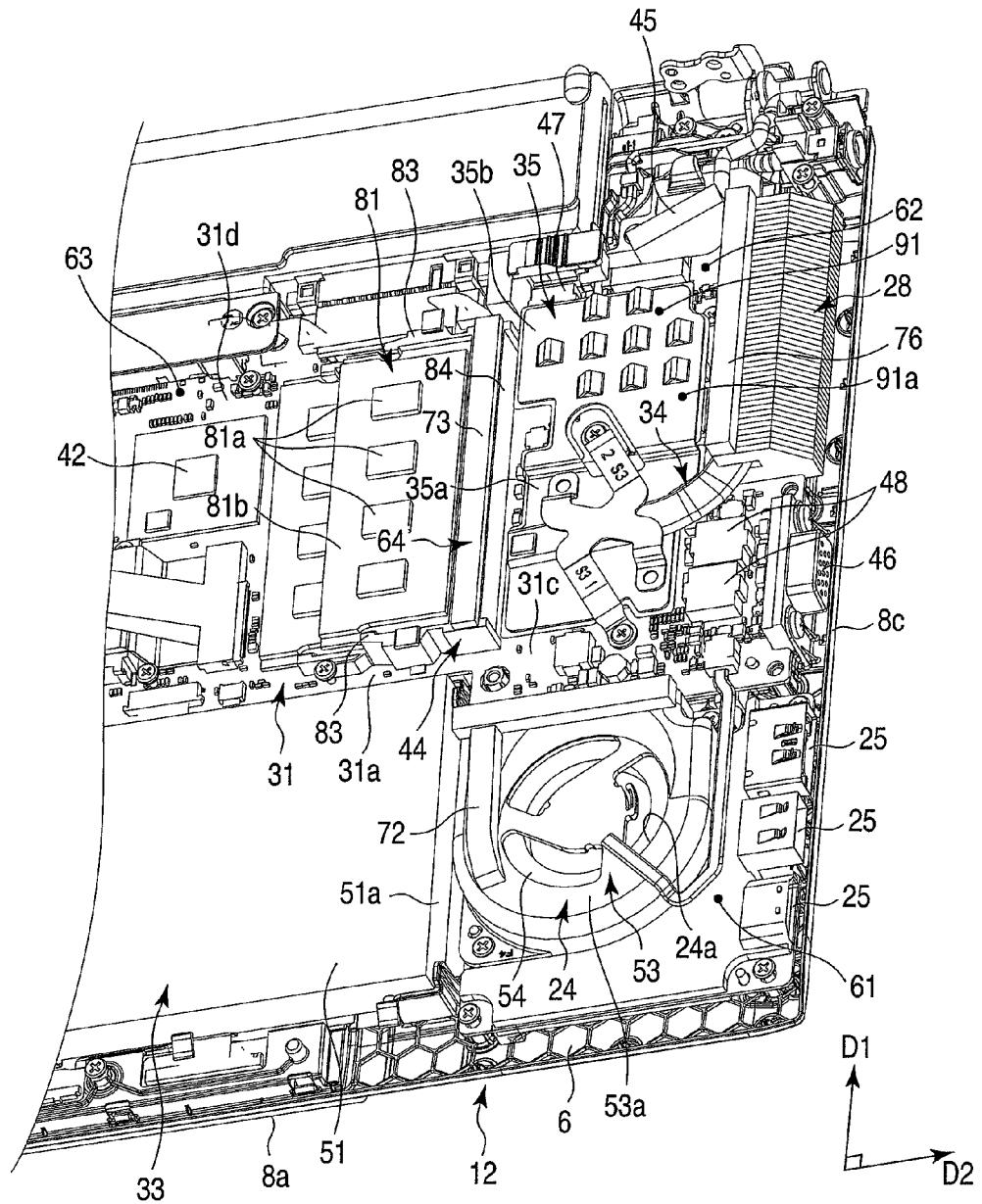
FIG. 5 is an exemplary perspective view illustrating the inside of the electronic apparatus shown in FIG. 1.

As show in FIG. 4, the housing 5 accommodates a circuit board 31, an ODD 32 (Optical Disk Drive), a storage device 33, the heat sink 28, a heat pipe 34, a heat radiating plate 35, and the cooling fan 24. The circuit board 31 is, for example, a main board.

The circuit board 31 includes a first surface 31a and a second surface 31b opposite to the first surface 31a. The first surface 31a is, for example, the lower surface. The second surface 31b is, for example, the upper surface. Alternatively, the first surface 31a may be the upper surface, and the second surface 31b may be the lower surface.

Figure 6:
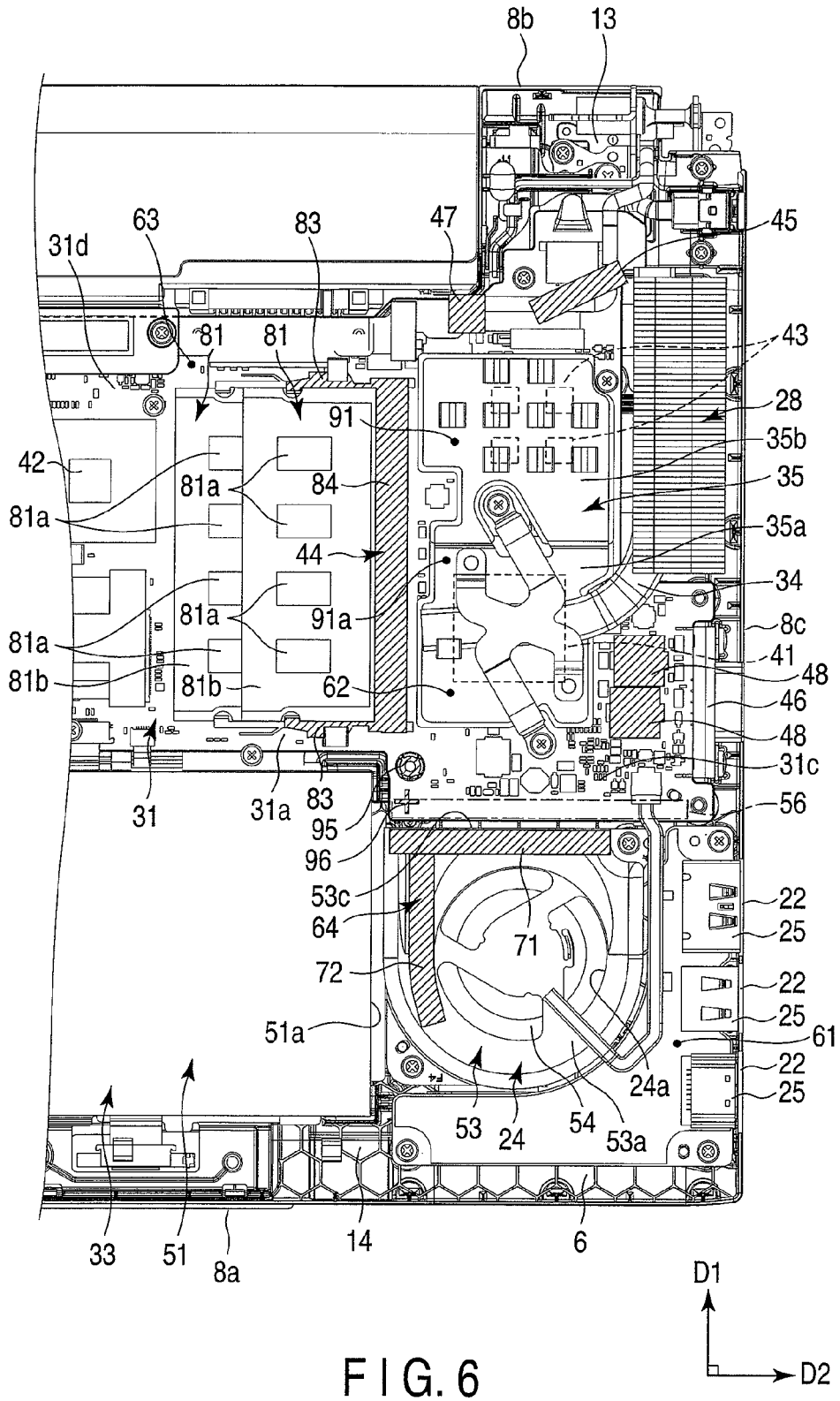
FIG. 6 is an exemplary plan view illustrating the inside of the electronic apparatus shown in FIG. 1 with some sealing members removed.

As shown in FIG. 6, a CPU 41 (Central Processing Unit), a PCH 42 (Platform Controller Hub), a power supply circuit component 43, a memory slot connector 44, an LCD connector 45, an I/O connector 46, a first power coil 47, and a second power coil 48 are provided on the first surface 31a of the circuit board 31.

The CPU 41 is an example of a first heating element and is a component generating the largest amount of heat among the components of the circuit board 31. The PCH 42 is an example of a heating element and is, for example, a component whose heat may be naturally radiated. The power supply circuit component 43 is an example of the heating element and is a component generating a relatively large amount of heat among the components of the circuit board 31.

As shown in FIG. 9, a power supply circuit component 49 is provided on the second surface 31b of the circuit board 31. The power supply circuit component 49 is an example of the heating element. The heating elements on the circuit board 31 are not limited to the above-mentioned components.

As shown in FIG. 4, a direction from the front end portion 14 to the rear end portion 13 of the housing 5 is defined as a first direction D1. A direction that is substantially orthogonal to the first direction D1 and is from the right wall 8d to the left wall 8c is defined as a second direction D2. A discharge hole 24c of the cooling fan 24, which will be described below, is opened in the first direction D1.

In the specification, the vertical and horizontal directions are defined based on the normal position (the position shown in FIG. 1) of the electronic apparatus 1. Therefore, in the description using FIGS. 2, 4 to 6, and 8 to 11 in which the electronic apparatus 1 is reversed, the upper, lower, right, and left expressions are contrary to the FIGS.

As shown in FIG. 9, the circuit board 31 is below the keyboard mounting portion 17. As shown in FIG. 4, the circuit board 31 includes a first portion 31c between the cooling fan 24 and the heat sink 28 and a second portion 31d deviating from the space between the cooling fan 24 and the heat sink 28.

The first portion 31c faces the cooling fan 24 in the direction (first direction D1) in which the discharge hole 24c of the cooling fan 24 is opened. That is, the first portion 31c is directly exposed to cooling air discharged from the cooling fan 24. In addition, the first portion 31c faces the heat sink 28 in the second direction D2. The second portion 31d does not face the cooling fan 24 in the direction in which the discharge hole 24c of the cooling fan 24 is opened.

The CPU 41 and the power supply circuit component 43 are mounted on the first portion 31c of the circuit board 31 and located between the heat sink 28 and the cooling fan 24. The PCH 42 is mounted on the second portion 31d of the circuit board 31 and deviates from the space between the heat sink 28 and the cooling fan 24.

The heat sink 28 is an example of the heat radiating portion, and is, for example, a fin unit including a plurality of fins. The heat sink 28 is provided in the rear end portion 13 of the housing 5 and faces the first outlet 26 of the housing 5. The heat sink 28 is below the keyboard mounting portion 17. In the heat sink 28, the gaps between the fins face the first outlets 26.

As shown in FIG. 6, the CPU 41 is closer to the cooling fan 24 than the power supply circuit component 43. The heat pipe 34 is an example of a heat transfer member. The heat pipe 34 extends from the CPU 41 to the heat sink 28. The heat pipe 34 thermally connects the CPU 41 to the heat sink 28 and transfers heat generated from the CPU 41 to the heat sink 28.

The heat radiating plate 35 is, for example, a metal plate member. The heat radiating plate 35 includes a first portion 35a facing the CPU 41 and a second portion 35b extended away from the CPU 41. The first portion 35a is thermally connected to the CPU 41. There is a step between the second portion 35b and the first portion 35a and the second portion 35b extends from the first portion 35a to, for example, the rear side. That is, the second portion 35b extends in the direction in which air is discharged from the cooling fan 24. There is a gap between the second portion 35b and the power supply circuit component 43 and the second portion 35b covers the lower side of the power supply circuit component 43. For example, the heat radiating plate 35 is not thermally connected to the power supply circuit component 43.

As shown in FIG. 4, the ODD 32 is accommodated in the right portion of the housing 5 opposite to the circuit board 31. An example of the storage device 33 is an HDD (Hard Disk Drive). The storage device 33 is provided in the front end portion 14 of the housing 5 so as to be adjacent to the cooling fan 24. The storage device 33 includes a case 51 and a magnetic disk (not shown) in the case 51. A side surface 51a (end surface) of the case 51 expands in a flat plate shape and faces the side of the cooling fan 24. The side surface 51a of the case 51 forms a rising wall facing the cooling fan 24 from the side opposite to the left wall 8c of the housing 5.

As shown in FIG. 6, the cooling fan 24 is away from the heat sink 28. For example, the cooling fan 24 is provided in the left portion of the front end portion 14 of the housing 5. As shown in FIG. 9, the cooling fan 24 is below the palm rest 18. That is, the cooling fan 24 deviates from the lower side of the keyboard mounting portion 17 where the thickness of the housing 5 is relatively small, and is below the palm rest 18 where the thickness of the housing 5 is relatively large. As shown in FIG. 9, there are gaps between the cooling fan 24 and the lower wall 7 of the housing 5 and between the cooling fan 24 and the upper wall 6 of the housing 5.

The cooling fan 24 is a centrifugal fan and includes a fan case 53 and an impeller 54 rotated in the fan case 53. The fan case 53 includes first intakes 24a, second intakes 24b, and a discharge hole 24c.

As shown in FIG. 9, the fan case 53 includes a lower surface 53a facing the lower wall 7, an upper surface 53b opposite to the lower surface 53a and facing the upper wall 6, and a circumferential surface 53c facing the circuit board 31. The first intakes 24a are provided in the lower surface 53a of the fan case 53 and face the first inlets 21 of the lower wall 7. The second intakes 24b are provided in the upper surface 53b of the fan case 53 and are opposite to the first intakes 24a. The second intakes 24b face the palm rest 18 with a gap therebetween.

As shown in FIG. 9, as described above, the discharge hole 24c is opened in the first direction D1 and faces the CPU 41 of the circuit board 31. The thickness of the discharge hole 24c is greater than that of the circuit board 31. The circuit board 31 faces a substantially intermediate portion of the discharge hole 24c in the thickness direction of the discharge hole 24c. The "circuit board facing the substantially intermediate portion" means that the circuit board 31 does not face the upper and lower ends of the discharge hole 24c. The circuit board 31 does not necessarily face the substantially intermediate portion of the discharge hole 24c in the thickness direction.

That is, the discharge hole 24c may be opened so as to extend from the upper side to the lower side of the circuit board 31. The discharge hole 24c includes a first portion 24ca close to the first surface 31a of the circuit board 31 and a second portion 24cb close to the second surface 31b of the circuit board 31.

The cooling fan 24 draws air in the housing 5 through the first intakes 24a and the second intakes 24b and discharges the air from the discharge hole 24c to the CPU 41. In this case, the cooling fan 24 discharges air to the upper and lower sides of the circuit board 31.

Figure 11:
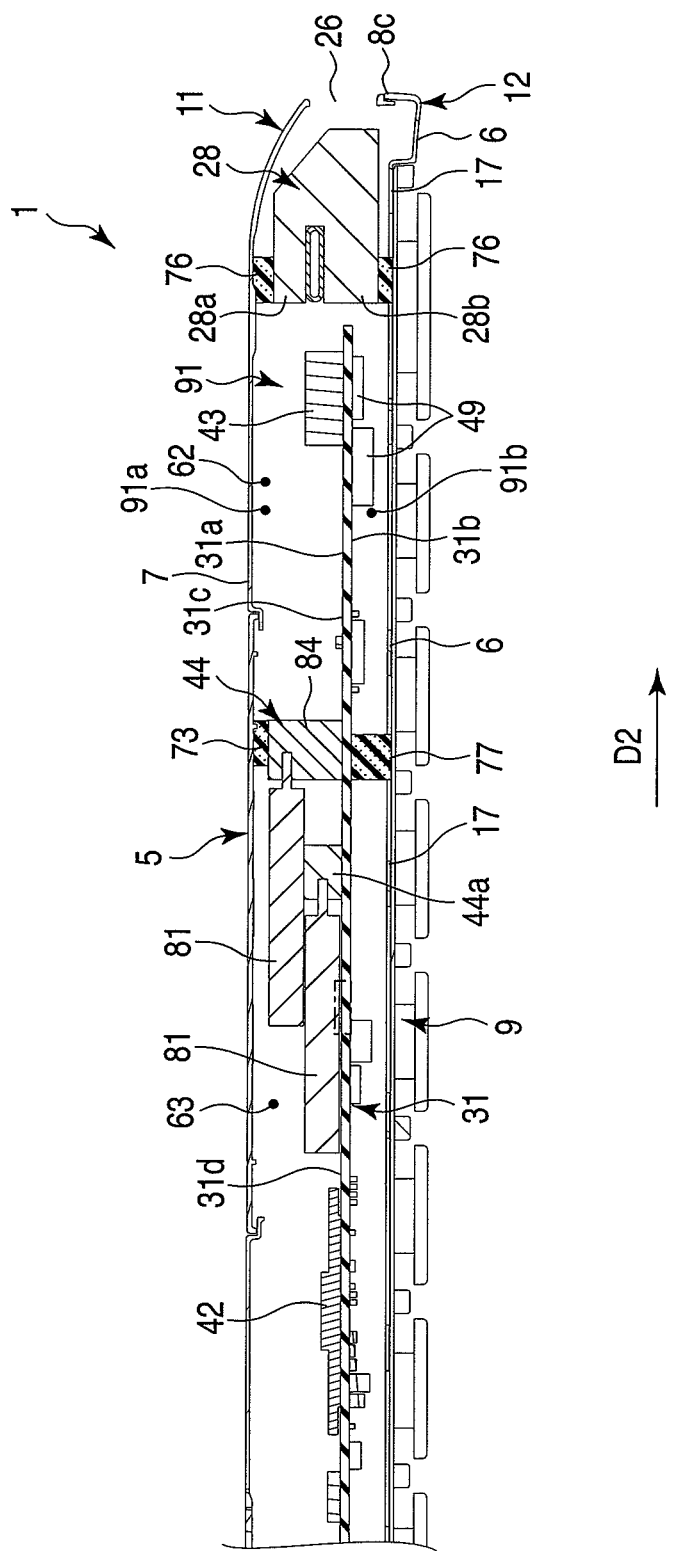
FIG. 11 is an exemplary cross-sectional view illustrating the electronic apparatus taken along the line F11-F11 of FIG. 8.

As shown in FIG. 11, the thickness of the heat sink 28 is larger than that of the circuit board 31. The circuit board 31 faces a substantially intermediate portion of the heat sink 28 in the thickness direction of the heat sink 28.

The "circuit board 31 facing the substantially intermediate portion" means that the circuit board 31 does not face the upper and lower ends of the heat sink 28. The circuit board 31 does not necessarily face the substantially intermediate portion of the heat sink 28 in the thickness direction.

That is, the heat sink 28 is exposed to the upper and lower sides of the circuit board 31. The heat sink 28 includes a first portion 28a close to the first surface 31a of the circuit board 31 and a second portion 28b close to the second surface 31b of the circuit board 31. The first portion 28a is exposed to air flowing along the first surface 31a of the circuit board 31. The second portion 28b is exposed to air flowing along the second surface 31b of the circuit board 31.

As shown in FIGS. 6 and 9, the end portion of the circuit board 31 facing the discharge hole 24c of the cooling fan 24 includes a component non-mounting region 56. The non-mounting region 56 has a width of, for example, 5 mm and extends in the width direction of the discharge hole 24c along the edge of the circuit board 31. The non-mounting region 56 is put on a rail of a mounting apparatus in a process of mounting components on the circuit board, such as a reflow process. No component is provided on the non-mounting region 56 and the non-mounting region 56 hardly hinders the flow of air discharged from the cooling fan 24.

As shown in FIG. 4, the electronic apparatus 1 includes a wind shielding portion 64 that partitions the inside of the housing 5 into a first chamber 61 (first region), a second chamber 62 (second region), and a third chamber 63 (third region). The first chamber 61 is an air drawing chamber in which the cooling fan 24 draws fresh air. The second chamber 62 is a duct in which components generating a relatively large amount of heat are mainly mounted and cooling air mainly flows from the cooling fan 24 to the heat sink 28. For example, components with sufficient natural heat radiation capability are in the third chamber 63. The term "chamber" means a region (portion) in the housing, and is not necessarily completely isolated from other chambers (other regions).

Figure 7:
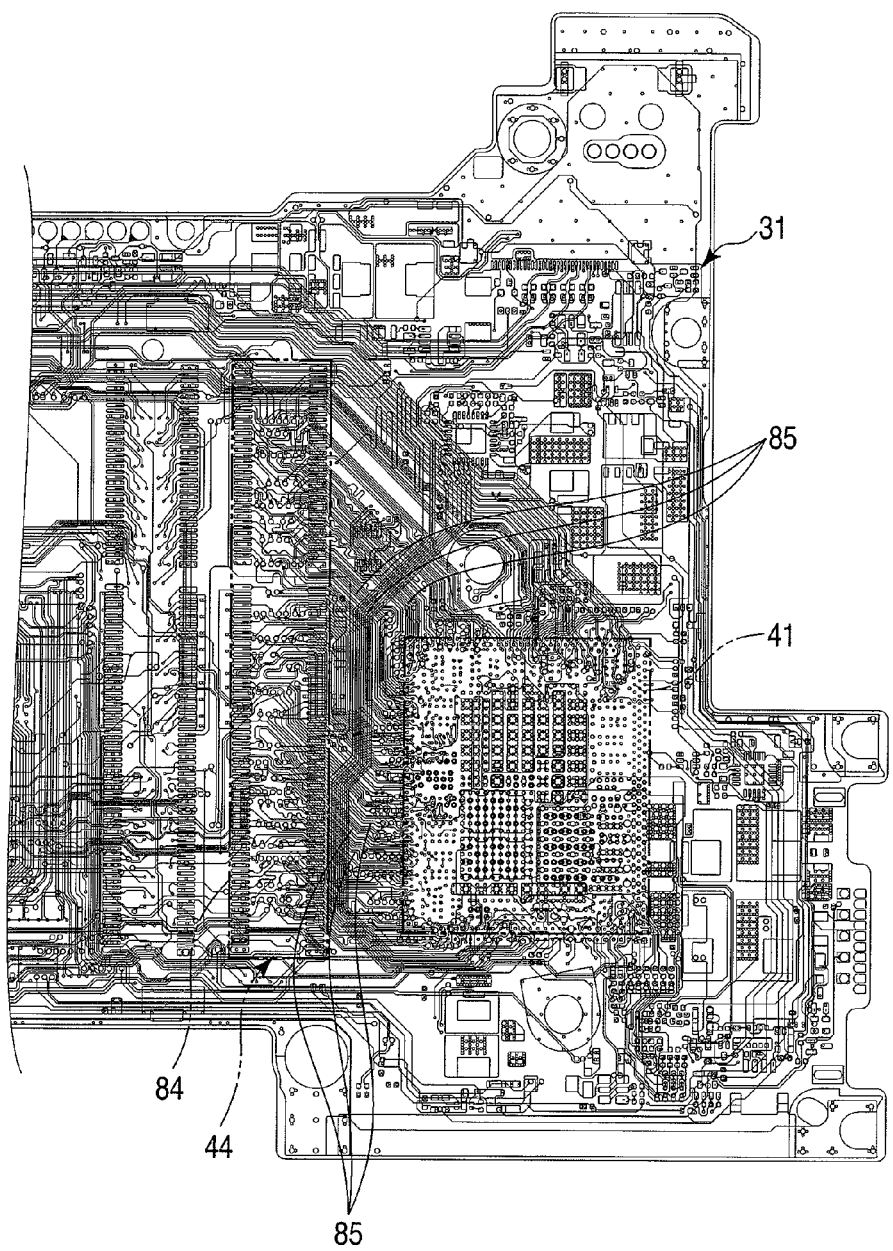
FIG. 7 is an exemplary plan view illustrating a wiring pattern of a circuit board shown in FIG. 6.

As shown in FIGS. 6 and 7, in this embodiment, the memory slot connector 44, the LCD connector 45, the first power coil 47, the second power coil 48, and some sealing members 71, 72, 73, 74, 75, 76, and 77 on the circuit board 31 form the wind shielding portion 64.

Each of the sealing members 71, 72, 73, 74, 75, 76, and 77 is an example of an elastic member and is also an example of a non-conductive member. Each of the sealing members 71, 72, 73, 74, 75, 76, and 77 is an insulating member, such as sponge, rubber, or an insulator. In FIG. 6, some sealing members 73, 74, and 75 are removed. In FIGS. 6 and 7, for convenience of description, the components forming the wind shielding portion 64 are hatched.

First, the wind shielding structure of the first chamber 61 will be described.

As shown in FIG. 6, the first sealing member 71 and the second sealing member 72 are attached to the lower surface 53a of the cooling fan 24. The first sealing member 71 extends in the width direction (second direction D2) of the discharge hole 24c along the discharge hole 24c of the cooling fan 24. That is, the first sealing member 71 is provided between the first intakes 24a and the discharge hole 24c and partitions the internal space of the housing 5.

The second sealing member 72 extends in the first direction D1 along the right end portion of the cooling fan 24. The second sealing member 72 is opposite to the left wall 8c of the housing 5 with the first intakes 24a of the cooling fan 24 interposed therebetween. That is, the first intakes 24a of the cooling fan 24 are located between the second sealing member 72 and the left wall 8c of the housing 5.

Figure 10:
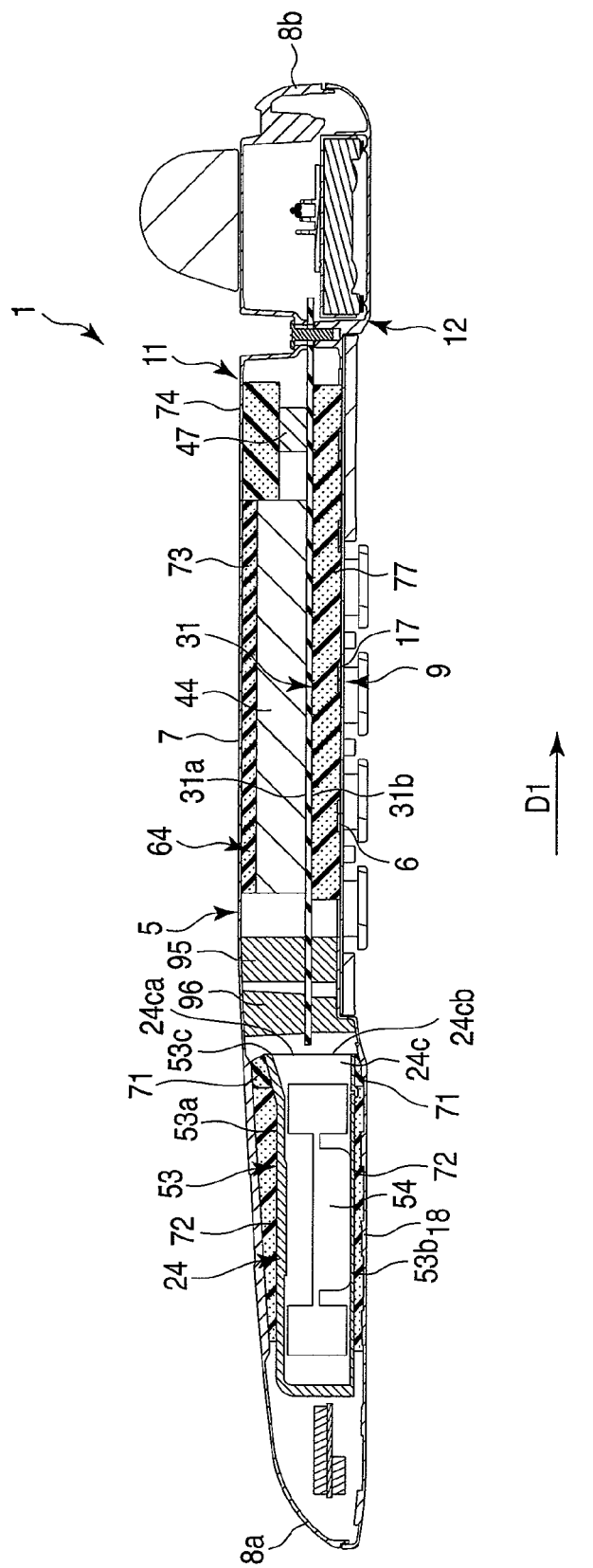
FIG. 10 is an exemplary cross-sectional view illustrating the electronic apparatus taken along the line F10-F10 of FIG. 8.

As shown in FIGS. 9 and 10, the first sealing member 71 and the second sealing member 72 are provided between the lower surface 53a of the cooling fan 24 and the inner surface of the lower wall 7 of the housing 5. The first sealing member 71 and the second sealing member 72 are compressed in the gap between the lower surface 53a of the cooling fan 24 and the inner surface of the lower wall 7 of the housing 5, thereby airtightly sealing the gap.

In this way, as schematically shown in FIG. 13, the first chamber 61 surrounded by the first sealing member 71, the second sealing member 72, the left wall 8c of the housing 5, and the front wall 8a of the housing 5 is formed in the corner of the housing 5.

In this embodiment, the first sealing member 71 and the second sealing member 72 are provided on the surface of the cooling fan 24 and are not provided in a region deviating from the cooling fan 24. That is, the first sealing member 71 and the second sealing member 72 do not completely partition the first chamber 61 in the housing 5, but partially partition the first chamber 61 in the housing 5.

The first sealing member 71 and the second sealing member 72 may extend to the region deviating from the cooling fan 24 and completely partition the first chamber 61 in the housing 5. In this embodiment, the side surface 51a of the case 51 of the storage device 33 supplementarily serves a part of the wall (i.e., side surface) of the first chamber 61.

As shown in FIGS. 9 and 10, another first sealing member 71 and another second sealing member 72 are on the upper surface 53b of the cooling fan 24, similarly to the lower surface 53a. That is, the first sealing member 71 extends in the width direction of the discharge hole 24c along the discharge hole 24c of the cooling fan 24. The first sealing member 71 is provided between the second intakes 24b and the discharge hole 24c and partitions the inner space of the housing 5. The second sealing member 72 extends in the first direction D1 along the right end portion of the cooling fan 24.

The first sealing member 71 and the second sealing member 72 are provided between the upper surface 53b of the cooling fan 24 and the inner surface (the inner surface of the palm rest 18) of the upper wall 6 of the housing 5. The first sealing member 71 and the second sealing member 72 are compressed in the gap between the upper surface 53b of the cooling fan 24 and the inner surface of the upper wall 6 of the housing 5, thereby airtightly sealing the gap.

As shown in FIGS. 6 and 9, the first inlets 21, the second inlets 22, and the third inlets 23 of the housing 5, and the first intakes 24a and the second intakes 24b of the cooling fan 24 are exposed to the first chamber 61. There is no heating element on the circuit board 31 in the first chamber 61. The first chamber 61 communicates with the housing 5 through the first inlets 21, the second inlets 22, and the third inlets 23 such that fresh air can flow into the first chamber 61. Therefore, the temperature of air in the first chamber 61 is lower than that in the other chambers.

Next, the wind shielding structure of the second chamber 62 (duct portion) will be described.

As shown in FIG. 6, the memory slot connector 44 to which a memory 81 is attached is mounted on the circuit board 31. The memory slot connector 44 is an example of a board component, an example of a long connector, and an example of a "component in the housing". The term "long connector" means that a length of a connector in its longitudinal direction is longer than one side of the chip of the CPU 41 (first heating element). The "long connector" is not limited to the memory slot connector 44, but may be, for example, a docking connector or a connector for a television tuner.

As shown in FIG. 6, the longitudinal direction of the memory slot connector 44 is aligned with the discharge direction (first direction D1) of the cooling fan 24. The memory 81 includes a memory board 81b on which a plurality of memory chips 81a is mounted. The memory slot connector 44 is adjacent to the CPU 41, with the memory 81 facing the opposite side of the CPU 41.

The memory slot connector 44 includes a pair of holders 83 that holds the memory 81 spaced apart from the circuit board 31 and a terminal portion 84 attached to the circuit board 31. The terminal portion 84 includes a slot to which the memory 81 is electrically connected and a plurality of wires for connecting the memory 81 to the CPU 41. The terminal portion 84 closely adheres to the circuit board 31 and there is no gap between the terminal portion 84 and the circuit board 31.

As shown in FIG. 11, the memory slot connector 44 is a second stage connector of a so-called two-stage memory connecting portion. That is, another memory slot connector 44a is mounted between the memory 81 attached to the memory slot connector 44 and the circuit board 31. In other words, the terminal portion 84 of the memory slot connector 44 is relatively high.

As shown in FIG. 6, the memory slot connector 44 is arranged such that the terminal portion 84 is closer to the CPU 41 than the holders 83. A portion of the memory slot connector 44 faces the CPU 41. The memory slot connector 44 is arranged in substantially parallel to the CPU 41. As shown in FIG. 7, the terminal portion 84 is electrically connected to the CPU 41 by a plurality of wiring patterns 85.

As shown in FIG. 6, the memory slot connector 44 extends from the side of the CPU 41 to the side of the power supply circuit component 43. The memory slot connector 44 faces a part of the heat sink 28, the second power coil 48, and the I/O connector 46 in the second direction D2.

As shown in FIG. 6, the first power coil 47 and the LCD connector 45 are provided between the end portion of the memory slot connector 44 and the end portion of the heat sink 28. Each of the first power coil 47 and the LCD connector 45 is an example of the board component. The first power coil 47 and the LCD connector 45 are arranged in the second direction D2.

The first power coil 47 and the LCD connector 45 face the discharge hole 24c of the cooling fan 24 in the first direction D1. That is, air discharged from the discharge hole 24c of the cooling fan 24 passes through the CPU 41 and the power supply circuit component 43, collides with the first power coil 47 and the LCD connector 45, and flows to the heat sink 28.

The second power coil 48 is opposite to the memory slot connector 44 with the CPU 41 interposed therebetween. The gap between the second power coil 48 and the memory slot connector 44 is substantially equal to the width of the discharge hole 24c of the cooling fan 24.

The memory slot connector 44, the first power coil 47, the LCD connector 45, and the second power coil 48 arranged in this way form a wind guide path 91 with a duct structure through which cooling air flows from the cooling fan 24 to the heat sink 28, in cooperation with the lower wall 7 and the left wall 8c of the housing 5. That is, each of the memory slot connector 44, the first power coil 47, the LCD connector 45, and the second power coil 48 forms at least a part of the wall surface of the wind guide path 91. In other words, each of the memory slot connector 44, the first power coil 47, the LCD connector 45, and the second power coil 48 is configured to serve as a wall that guides cooling air from the cooling fan 24 to the heat sink 28.

Specifically, the wind guide path 91 according to this embodiment includes a first flow path 91a and a second flow path 91*b*. The first flow path 91*a* is formed in a substantially L shape on the first surface 31*a* of the circuit board 31 (that is, between the circuit board 31 and the lower wall 7 of the housing 5). The second flow path 91*b* is formed on the second surface 31*b* of the circuit board 31 (that is, between the circuit board 31 and the upper wall 6 of the housing 5) in the same shape as that of the first flow path 91*a*, that is, in a substantially L shape.

The memory slot connector 44, the first power coil 47, the LCD connector 45, and the second power coil 48 form the first flow path 91*a*. As shown in FIG. 6, the CPU 41, the power supply circuit component 43, the heat pipe 34, and the heat radiating plate 35 are located in the wind guide path 91. That is, the CPU 41, the power supply circuit component 43, the heat pipe 34, and the heat radiating plate 35 are provided between the cooling fan 24 and the heat sink 28.

Figure 8:
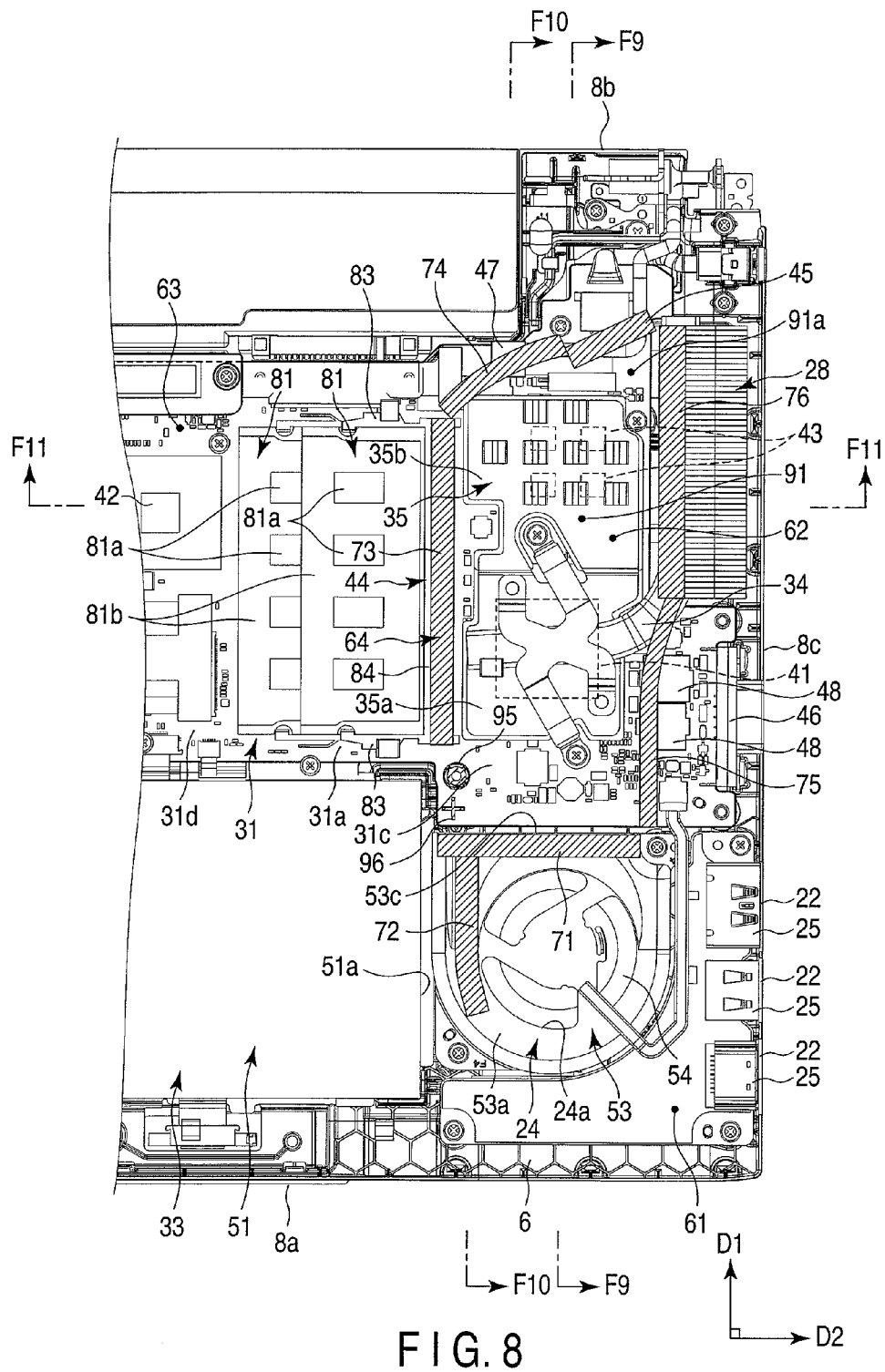
FIG. 8 is an exemplary plan view illustrating the inside of the electronic apparatus shown in FIG. 1.

As shown in FIGS. 8 and 10, the third sealing member 73 is provided between the terminal portion 84 of the memory slot connector 44 and the inner surface of the lower wall 7 of the housing 5. The third sealing member 73 is an example of the first sealing portion. The third sealing member 73 extends in the first direction D1. The third sealing member 73 has a length substantially equal to that of the terminal portion 84 of the memory slot connector 44.

The third sealing member 73 is compressed in the gap between the memory slot connector 44 and the lower wall 7 of the housing 5, thereby airtightly sealing the gap. The third sealing member 73 forms a part of the wall surface of the first flow path 91*a* of the wind guide path 91.

As shown in FIGS. 8 and 10, the housing 5 includes a boss 95 and a rib 96, which are protrusions protruding from the inner surface of the lower wall 7 of the housing 5 toward the circuit board 31. The boss 95 and the rib 96 are positioned between the cooling fan 24 and the memory slot connector 44 and form a part of the wall surface of the wind guide path 91.

As shown in FIG. 8, the fourth sealing member 74 is provided between the first power coil 47 and the inner surface of the lower wall 7 of the housing 5. For example, the fourth sealing member 74 extends from the end portion of the memory slot connector 44 to the end portion of the LCD connector 45. The fourth sealing member 74 is compressed in the gap between the first power coil 47 and the lower wall 7 of the housing 5, thereby airtightly sealing the gap. The fourth sealing member 74 may extend to, for example, the end portion of the heat sink 28. In addition, the fourth sealing member 74 may be provided between the LCD connector 45 and the inner surface of the lower wall 7 of the housing 5.

As shown in FIG. 8, the fifth sealing member 75 is provided between the second power coil 48 and the inner surface of the lower wall 7 of the housing 5. For example, the fifth sealing member 75 extends from the end portion of the cooling fan 24 to the end portion of the heat sink 28. The fifth sealing member 75 is compressed in the gap between the second power coil 48 and the lower wall 7 of the housing 5, thereby airtightly sealing the gap. For example, the fifth sealing member 75 may be only in a portion of the space between the cooling fan 24 and the heat sink 28. Each of the fourth sealing member 74 and the fifth sealing member 75 forms a part of the wall surface of the first flow path 91*a* of the wind guide path 91.

As shown in FIGS. 8 and 11, the sixth sealing member 76 is provided between the heat sink 28 and the inner surface of the lower wall 7 of the housing 5. The sixth sealing member 76 extends over the entire length of the heat sink 28 in the longitudinal direction (first direction D1). The sixth sealing member 76 is compressed in the gap between the heat sink 28 and the lower wall 7 of the housing 5, thereby airtightly sealing the gap. In this way, cooling air reaching the heat sink 28 is exhausted to the outside through the gaps between the fins of the heat sink 28 without passing through the gap between the heat sink 28 and the inner surface of the housing 5.

As shown in FIG. 11, similarly, the sixth sealing member 76 is provided between the heat sink 28 and the inner surface of the upper wall 6 of the housing 5. The sixth sealing member 76 is compressed in the gap between the heat sink 28 and the upper wall 6 of the housing 5, thereby airtightly sealing the gap.

As shown in FIG. 11, the keyboard mounting portion 17 according to this embodiment includes a relatively large opening portion through which the keyboard 9 is exposed to the housing 5. The sixth sealing member 76 also extends between the heat sink 28 and the lower surface of the keyboard 9. The sixth sealing member 76 is compressed in the gap between the heat sink 28 and the lower surface of the keyboard 9, thereby airtightly sealing the gap.

As shown in FIG. 10, the seventh sealing member 77 is provided between the second surface 31*b* of the circuit board 31 and the inner surface of the upper wall 6 of the housing 5. The seventh sealing member 77 is an example of a second sealing portion. The seventh sealing member 77 is compressed in the gap between the circuit board 31 and the inner surface of the upper wall 6 of the housing 5, thereby airtightly sealing the gap. When a board component is mounted on the second surface 31*b* of the circuit board 31, a sealing member between the board component and the inner surface of the housing is also included in "the sealing member between the second surface of the circuit board and the inner surface of the housing".

As shown in FIG. 10, the seventh sealing member 77 also extends between the second surface 31*b* of the circuit board 31 and the lower surface of the keyboard 9. The seventh sealing member 77 is compressed in the gap between the second surface 31*b* of the circuit board 31 and the lower surface of the keyboard 9, thereby airtightly sealing the gap.

For example, the seventh sealing member 77 has substantially the same shape as an integrated body of the third sealing member 73 and the fourth sealing member 74. However, the shape of the seventh sealing member 77 is not limited thereto.

The seventh sealing member 77, the upper wall 6 (or the keyboard 9) of the housing 5 and the left wall 8*c* of the housing 5 form the second flow path 91*b* of the wind guide path 91 through which cooling air flows from the cooling fan 24 to the heat sink 28. That is, the seventh sealing member 77 forms a part of the wall (i.e., side surface) of the wind guide path 91. As shown in FIG. 9, the power supply circuit component 49 is located in the second flow path 91*b*.

Air discharged from the first portion 24*ca* of the discharge hole 24*c* of the cooling fan 24 flows through the first flow path 91*a* and reaches the first portion 28*a* of the heat sink 28. Air discharged from the second portion 24*cb* of the discharge hole 24*c* of the cooling fan 24 flows through the second flow path 91*b* and reaches the second portion 28*b* of the heat sink 28. The gap between the second surface 31*b* of the circuit board 31 and the upper wall 6 of the housing 5 is smaller than the gap between the first surface 31*a* and the lower wall 7 of the housing 5.

As shown in FIG. 8, the second chamber 62 surrounded by the memory slot connector 44, the third sealing member 73, the first power coil 47, the fourth sealing member 74, the LCD connector 45, the boss 95, the rib 96, the seventh sealing member 77, and the left wall 8*c* of the housing 5 is formed in the left end portion of the housing 5. Each of the components according to this embodiment does not completely partition the second chamber 62 in the housing 5, but partially partitions the second chamber 62 in the housing 5. The second chamber 62 may be completely partitioned in the housing 5.

The first outlets 26, the second outlets 27, the CPU 41, the power supply circuit component 43, the power supply circuit component 49, the heat sink 28, the heat pipe 34, the heat radiating plate 35, and the discharge hole 24c of the cooling fan 24 of the housing 5 are exposed to the second chamber 62.

As shown in FIG. 4, the housing 5 includes the third chamber 63 at least partially partitioned from the first chamber 61 and the second chamber 62. The third chamber 63 is partitioned from the first chamber 61 and the second chamber 62 by the second sealing member 72, the boss 95, the rib 96, the memory slot connector 44, the third sealing member 73, the first power coil 47, the fourth sealing member 74, the LCD connector 45, and the seventh sealing member 77.

As shown in FIG. 2, the third chamber 63 communicates with the outside through vent holes 98 in the lower wall 7 of the housing 5. As shown in FIG. 4, the PCH 42, the memory 81, the ODD 32, and the storage device 33 are exposed to the third chamber 63. A heat radiating member is not attached to the PCH 42 or the memory 81, and heat generated from the PCH 42 and the memory 81 is naturally radiated.

The first portion 31c of the circuit board 31 is exposed to the second chamber 62. The second portion 31d of the circuit board 31 is exposed to the third chamber 63. Each of the components according to this embodiment does not completely partition the third chamber 63 in the housing 5, but partially partitions the third chamber 63. The third chamber 63 may be completely partitioned in the housing 5.

Next, the operation of the electronic apparatus 1 will be described with reference to FIGS. 12 to 14 schematically showing the structure of this embodiment.

As shown in FIGS. 12 and 13, the inside of the housing 5 is divided into the first chamber 61 and the second chamber 62. A structure (the first sealing member 71 and the second sealing member 72) that shields the flow of air is provided between the first chamber 61 and the second chamber 62. The first intakes 24a and the second intakes 24b of the cooling fan 24 are exposed to the first chamber 61. The discharge hole 24c of the cooling fan 24 is exposed to the second chamber 62. That is, a partial sealing region that closes up the air intakes 24a and 24b of the cooling fan 24 is formed in the corner of the housing 5.

The cooling fan 24 draws air from the outside of the housing 5 to the first chamber 61 and discharges the air from the first chamber 61 to the second chamber 62. The air intakes 24a, 24b of the cooling fan 24 are not exposed to the second chamber 62 and the third chamber 63. Therefore, the cooling fan 24 draws a small amount of air or hardly draws air in the second chamber 62 and the third chamber 63 heated by the CPU 41 or the PCH 42, the power supply circuit component 43, and the other heating elements.

The cooling fan 24 draws low-temperature air from the outside of the housing 5 through the first chamber 61 and discharges the low-temperature air to, for example, the CPU 41 in the second chamber 62. In this embodiment, the air inlets are in the lower wall 7 and the circumferential wall 8 of the housing 5. However, the air inlets may be in at least one of the upper wall 6, the lower wall 7, and the circumferential wall 8 of the housing 5.

As shown in FIG. 14, the wind guide path 91 guiding cooling air from the cooling fan 24 to the heat sink 28 is formed in the housing 5 by the board components on the circuit board 31. Specifically, the memory slot connector 44, the first power coil 47, the LCD connector 45, and the second power coil 48 form both wall surfaces of the wind guide path 91.

That is, a space surrounded by the memory slot connector 44, the first power coil 47, the LCD connector 45, the second power coil 48, the circuit board 31, and the lower wall 7 and the upper wall 6 (or the keyboard 9) of the housing 5 is the wind guide path 91. In this embodiment, the airtightness of the wind guide path 91 is improved by the third to seventh sealing members 73, 74, 75, 76, and 77.

Therefore, as represented by an arrow in FIG. 14, cooling air discharged from the cooling fan 24 flows to the heat sink 28 on the circuit board 31. That is, cooling air discharged from the cooling fan 24 is reliably focused on, for example, the CPU 41 or the heat sink 28 without being widely spread in the housing 5, thereby effectively cooling the CPU 41 or the heat sink 28.

According to this structure, it is possible to improve cooling efficiency.

For example, as an example of the air drawing structure, the following structure is considered: intakes in the lower surface of the cooling fan face inlets in the lower wall of the housing and intakes are provided in the upper surface of the cooling fan in the housing. In this case, the intakes in the lower surface of the cooling fan can draw low-temperature fresh air, and the intakes in the upper surface of the cooling fan draw warm air in the housing 5. Therefore, air discharged from the cooling fan 24 does not have a relatively low temperature. Therefore, it is difficult to effectively cool, for example, the heat sink 28 exposed to the air.

However, in the structure according to this embodiment, the wind shielding portion 64 that at least partially partitions the inner space of the housing 5 is between the intakes 24a and 24b of the cooling fan 24 and the discharge hole 24c of the cooling fan 24. Therefore, the air, which has been discharged from the discharge hole 24c and then heated by the CPU 41 or the heat sink 28, is less likely to be drawn through the intakes 24a and 24b. As a result, it is possible to blow relatively low-temperature air to the CPU 41 or the heat sink 28 and thus improve heat radiation efficiency.

In this embodiment, the first chamber 61 to which the inlets 21, 22, and 23 of the housing 5 and the intakes 24a and 24b of the cooling fan 24 are exposed is at least partially partitioned from the second chamber 62 to which the outlets 26 and 27 of the housing 5, the CPU 41, the heat sink 28, the heat pipe 34, and the discharge hole 24c of the cooling fan 24 are exposed by the wind shielding portion 64 in the housing 5. Therefore, air heated by the CPU 41, the heat sink 28, or the heat pipe 34 is less likely to flow back to the intakes 24a and 24b of the cooling fan 24.

In this embodiment, the first chamber 61 that draws ambient fresh air into the housing 5 is provided, and the first intakes 24a in the upper surface 53a of the cooling fan 24 and the second intakes 24b in the lower surface 53b of the cooling fan 24 are exposed to the first chamber 61. A heating element, such as the CPU 41, is in the second chamber 62 partitioned from the first chamber 61. According to this structure, the second intakes 24b in the upper surface of the cooling fan 24, in addition to the first intakes 24a in the lower surface 53b of the cooling fan 24, can draw low-temperature fresh air, not warm air in the housing 5.

Therefore, it is possible to blow low-temperature air to the CPU 41 or the heat sink 28 and thus further improve heat radiation efficiency. That is, the cooling fan 24 incorporated into the housing 5 may draw almost 100% of fresh air from the outside and discharge (blows) almost 100% of fresh air into the housing 5, regardless of the type of cooling fan.

The cooling fan 24 is a component with a relatively large height (thickness) among the components in the housing 5. When the cooling fan 24 is below the palm rest 18, it is possible to accommodate the cooling fan 24 below the palm rest 18 in which the thickness of the housing 5 is larger than that below the keyboard mounting portion 17. Therefore, it is possible to reduce the thickness of the housing 5.

For example, as an example of the air drawing structure, the following structure is considered: intakes in the lower surface of the cooling fan face inlets in the lower wall of the housing and intakes are formed in the upper surface of the cooling fan in the housing. In this case, when the inlets in the lower wall of the housing are clogged for some reason, the intakes in the lower surface of the cooling fan draw warm air in the housing. Therefore, cooling efficiency may be reduced.

However, in this embodiment, the first chamber 61 for drawing air is in the housing 5 and the first chamber 61 includes the second inlets 22 in addition to the first inlets 21. In this structure, even when the first inlets 21 are clogged, the first chamber 61 communicates with the outside through the second inlets 22. Since the intakes 24a and 24b are formed in the cooling fan 24 in the first chamber 61, it is possible to draw low-temperature fresh air from the first chamber 61. Therefore, even when some of the inlets of the housing 5 are clogged, cooling efficiency is less likely to be reduced.

When the first inlets 21 are in the lower wall 7 of the housing 5 and the second inlets 22 are in the circumferential wall 8 of the housing 5, two kinds of inlets 21 and 22 are less likely to be clogged at the same time and the first chamber 61 easily communicates with the outside.

When a second heating element (for example, the PCH 42) whose heat is naturally radiated is further provided and the third chamber 63 including the second heating element is at least partially partitioned from the first chamber 61 and the second chamber 62 by the wind shielding portion 64 in the housing 5, it is possible to focus the flow of cooling air discharged from the cooling fan 24 on the second chamber 62 and air heated by the third chamber 63 is less likely to be drawn by the cooling fan 24. Therefore, it is possible to improve the overall cooling efficiency of the apparatus.

Second Embodiment

Next, an electronic apparatus 1 according to a second embodiment will be described with reference to FIG. 15. In the second embodiment, components having the same or similar functions as those of the first embodiment are denoted by the same reference numerals and a description thereof will not be repeated. In addition, structures other than the following structures are the same as those in the first embodiment.

As shown in FIG. 15, in this embodiment, an I/O connector 46 forms a part of the wall (i.e., side surface) of a wind guide path 91. The I/O connector 46 includes a shell 101 made of metal and a terminal portion (not shown) in the shell 101. A housing 5 is made of metal, for example. The housing 5 may be made of a resin and may have a conductor layer on the inner surface thereof. The conductor layer is formed by, for example, plating, a conductive coating layer, or the attachment of a metal foil.

A conductive member 102 is provided between the I/O connector 46 and the housing 5. The conductive member 102 is, for example, a gasket. However, the conductive member 102 may be a leaf spring instead of the gasket. The conductive member 102 is provided between the I/O connector 46 and the housing 5 and electrically connects the I/O connector 46 to the housing 5. The conductive member 102 functions as a member for ESD (Electro-Static Discharge) or EMI (Electro Magnetic Interference).

In this embodiment, the conductive member 102 forms a part of the wall (i.e., side surface) of the wind guide path 91. That is, the conductive member 102 is configured to serve as a wall that guides cooling air from a cooling fan 24 to a heat sink 28. The connector on which the conductive member 102 is provided is not limited to the I/O connector 46, but may be other kinds of connectors.

As shown in FIG. 15, a heating component 103 is mounted on a second surface 31b of a circuit board 31. The heating component 103 is an example of the second heating element and is, for example, a power coil, a capacitor, or an IC. The heating component 103 is not limited thereto, and only needs to be a component with a temperature higher than the average temperature of the circuit board 31. In this embodiment, the heating component 103 forms a part of the wall (i.e., side surface) of the wind guide path 91. That is, the heating component 103 is configured to serve as a wall that guides cooling air from the cooling fan 24 to the heat sink 28.

The housing 5 includes a rib 104 whose protrusion is adjusted according to the height of a component (in this embodiment, the heating component 103) forming a part of the wall (i.e., side surface) of the wind guide path 91. The rib 104 is an example of the wind shielding portion. The rib 104 protrudes from the inner surface of the housing 5 toward the component forming a part of the wall (i.e., side surface) of the wind guide path 91 such that a gap of, for example, several millimeters exists between the rib 104 and the component. The rib 104 forms a part of the wall (i.e., side surface) of the wind guide path 91.

According to this structure, it is possible to improve cooling efficiency, similarly to the first embodiment.

Third Embodiment

Next, a display device 111 according to a third embodiment will be described with reference to FIG. 16. In the third embodiment, components having the same or similar functions as those of the first embodiment are denoted by the same reference numerals and a description thereof will not be repeated. In addition, structures other than the following structures are the same as those in the first embodiment.

As shown in FIG. 16, the display device 111 includes a housing 5 and a display panel 16 in the housing 5. An example of the display device 111 is a television. The same structure as that in the first embodiment or the second embodiment is in the housing 5.

According to the display device 111 having the above-mentioned structure, similarly to the first embodiment or the second embodiment, it is possible to mount components at high density.

The electronic apparatuses 1 and the display device 111 according to the first to third embodiments have been described above, but the embodiments are not limited thereto. The embodiments are not limited to the above-described embodiments, but the components may be changed without departing from the scope and spirit of the invention.

For example, the third chamber 63 is not necessarily partitioned in the housing 5, but it is only necessary that the first chamber 61 be partitioned from the second chamber 62. The wind guide path 91 is not necessarily provided. That is, the sealing members 73, 74, 75, 76, and 77 may be omitted. The members partitioning the first chamber 61, the second chamber 62, and the third chamber 63 may not be the sealing members, but may be a portion of the housing 5 (for example, a rib). The first intake 24a may not necessarily face the inlet 21 of the lower wall 7.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
   a housing comprising a first circumferential wall and a second circumferential wall, the first circumferential wall comprising an outlet, the second circumferential wall extending in a direction intersecting the first circumferential wall;
   a cooling fan in the housing, the cooling fan comprising an intake and a discharge hole;
   a circuit board in the housing, the circuit board comprising a heating element at a position configured to receive a wind from the discharge hole;
   a heat sink along the first circumferential wall, the heat sink thermally connected to the heating element and at least partially facing the outlet;
   a wind guide partially opposite to the first circumferential wall with respect to the heating element, the wind guide configured to guide the wind from the cooling fan to the heating element;
   a first wind shield comprising a portion located between the heating element and the second circumferential wall, the portion inclining toward the heat sink as extending away from the cooling fan, the first wind shield configured to direct the wind flowing between the heating element and the second circumferential wall from the discharge hole toward the heat sink; and
   a second wind shield partially opposite to the first wind shield with respect to the heating element, the second wind shield configured to direct the wind flowing on a side of the first circumferential wall from the discharge hole toward the heat sink.

2. The electronic apparatus of claim 1, wherein:
   the heating element is a quadrilateral substantially parallel to the discharge hole and comprises a first end facing the discharge hole and a second end opposite to the first end; and
   the first wind shield partially faces the second end of the heating element from a side opposite to the cooling fan.

3. The electronic apparatus of claim 1, wherein:
   the wind guide comprises a component along a flow direction of the wind from the cooling fan; and
   the first wind shield at least partially extends between the component and the heat sink.

4. The electronic apparatus of claim 1, wherein at least a part of the first wind shield is an electronic component projecting higher from a surface of the circuit board than the heating element.

5. The electronic apparatus of claim 1, wherein the first wind shield comprises a plurality of components in series.

6. The electronic apparatus of claim 1, further comprising a third wind shield between the heat sink and an inner surface of the housing.

7. The electronic apparatus of claim 1, wherein the first wind shield is on the circuit board.

8. The electronic apparatus of claim 1, wherein the heating element is in a space partially partitioned from four directions by a wind shield structure comprising the wind guide, the first wind shield and the second wind shield.

* * * * *